United States Patent [19]
Kawagishi et al.

[11] Patent Number: 5,373,494
[45] Date of Patent: Dec. 13, 1994

[54] INFORMATION RECORDING AND/OR REPRODUCING APPARATUS

[75] Inventors: Hideyuki Kawagishi, Ayase; Haruki Kawada, Yokohama; Kiyoshi Takimoto, Isehara; Toshimitsu Kawase, Ayase; Yuko Morikawa, Yokohama; Katsuhiko Shinjo, Isehara, all of Japan

[73] Assignee: Canon Kabushiki Kaisha, Tokyo, Japan

[21] Appl. No.: 896,372

[22] Filed: Jun. 10, 1992

[30] Foreign Application Priority Data

Jun. 12, 1991 [JP] Japan .................................. 3-140108

[51] Int. Cl.$^5$ .............................................. G01B 7/34
[52] U.S. Cl. .................................................... 369/126
[58] Field of Search ............... 369/126, 101, 124, 100; 250/306, 307; 360/110, 114

[56] References Cited

U.S. PATENT DOCUMENTS

| | | | |
|---|---|---|---|
| 3,710,352 | 1/1973 | Smith et al. | 340/173.2 |
| 3,872,445 | 5/1975 | Pease | 340/172.5 |
| 5,036,490 | 7/1991 | Kajimura et al. | 365/161 |
| 5,075,548 | 12/1991 | Kajimura | 250/306 |
| 5,132,533 | 7/1992 | Kawase et al. | 250/306 |

FOREIGN PATENT DOCUMENTS

| | | | |
|---|---|---|---|
| 381113 | 8/1990 | European Pat. Off. | G11B 9/00 |
| 382192 | 8/1990 | European Pat. Off. | G11B 9/10 |
| 397416 | 11/1990 | European Pat. Off. | G01N 27/00 |
| 2637409 | 4/1990 | France | G11C 11/21 |
| 3823010 | 9/1989 | Germany | G11B 9/06 |
| 4022711 | 7/1990 | Germany | H01J 37/28 |
| 62-281138 | 12/1987 | Japan | G11B 9/00 |
| 89/07256 | 8/1989 | WIPO | G01N 23/00 |

OTHER PUBLICATIONS

Havant, "Document Storage on Video Disc", in *Research Disclosure*, Oct. 1979, at pp. 568–570.
Kennedy, "Digital Data Storage Using Video Disc", in *IBM Technical Disclosure Bulletin*, vol. 24, No. 2, Jul. 1981, at pp. 1171–1172.
Binning et al., "Surface Studies by Scanning Tunneling Microscopy" in Phys. Rev. Letters vol. 49, No. 1, Jul. 1982, at pp. 57–60.
Petersen, "Silicon as a Mechanical Material", in *Proc of IEEE*, vol. 70, No. 5, May 1982, at pp. 420–457.

*Primary Examiner*—Paul M. Dzierzynski
*Assistant Examiner*—Don Wong
*Attorney, Agent, or Firm*—Fitzpatrick, Cella, Harper & Scinto

[57] ABSTRACT

An information recording and/or reproducing apparatus includes a recording medium having a plurality of segmented planar electrodes, a plurality of probe electrodes respectively facing and electrically connected to the plural planar electrodes, and a circuit for independently applying a voltage for recording and/or reproducing between each pair of the planar electrodes and the probe electrodes. The information recording and/or reproducing apparatus includes a circuit for inputting information to be recorded on the recording medium. A memory other than the recording medium is used for temporarily storing the input information, and a control circuit applies the recording voltages between the plurality of probe electrodes and the segmented planar electrodes in correspondence with the information stored in the memory.

4 Claims, 8 Drawing Sheets

A; INPUT STATE
B; OUTPUT STATE
C; CLEAR STATE OR CEASE STATE

INFORMATION RECORDING AND/OR REPRODUCING APPARATUS

BACKGROUND OF THE INVENTION

1. Field of the Invention

The present invention relates to an information recording and/or reproducing apparatus to which a principle of a scanning tunnel microscope is applied.

2. Related Background Art

A scanning tunnel microscope (STM) is a recent development which is capable of directly observing an electron structure of surface atoms in a conductive material (G. Binnig et al. Phys. Rev. Lett, 49, 57 (1982)). The STM allows observation of a real space image with an extremely high resolving power, both for a single crystal and for an amorphous substance. The STM uses a tunnel current which flows if a probe and a conductive substance are brought close to each other, for example a distance of about 1 nm with a voltage being applied therebetween. The electric current changes exponentially in response to a change of distance between the probe and the conductive substrate. Thus if the probe is scanned to keep the tunnel current constant, a surface structure of real space may be observed with a resolving power on the order a atom. Although an analysis using the STM is limited to a conductive material, its applications also apply to structural analysis of a thin insulating layer formed on a surface of a conductive material. Further, since such apparatus and means use a method for detecting a micro electric current, the STM is advantageously used to observe a medium without any damage thereto, and with a low power consumption. Also, broad applications of STM use are expected because of its operability in air.

The utilization of STM a as a record reproduction apparatus of high density is known, for example as proposed in Japanese Laid-Open Patent Applications Nos. 63-161552 and 63-161553. The apparatus uses a probe similar to that used in the STM, and in which an applied voltage is changed between the probe and a recording medium to record data on the recording medium. The recording medium is a material having a switching property with memory in a voltage-current property, for example a thin film layer of a material selected from chalcogenides and $\pi$-electron organic compounds. The reproduction is based on a difference of tunnel resistance between a region thus recorded and a region not recorded. Also, the recording and reproduction is possible with a recording medium in which recording is achieved by changing a surface shape of the recording medium by applying a voltage to the probe.

Another recording and reproducing apparatus is proposed in Japanese Laid-Open Patent Application No. 61-206148 using a STM, the semiconductor producing process technique for formation of the probe, and a processing techniques for making a fine structure on a single substrate (K. E. Peterson, "Silicon as a Mechanical Material", Proceedings of the IEEE, Vol. 70, p. 420, 1982). The apparatus is constituted such that a substrate is made of a single crystal silicon, parallel springs are formed by fine processing to be finely movable in a direction parallel to a surface of the substrate, i.e., in x, y-directions a tongue of a cantilevered beam with a probe formed thereon is provided on a moving part of the parallel spring, an electric field is applied between a torque and a base, and the probe may be displaced by an electrostatic force in a direction perpendicular to the substrate surface, i.e. in the z-direction.

Similarly, Japanese Laid-Open Patent Application No. 62-281138 describes a recording apparatus provided with a converter allay in which multiple tongues similar to that disclosed in the above Japanese Laid-Open Patent Application No. 61-206148 are arranged.

A memory capacity of the above apparatus can be considered to increase by increasing an area of the recording medium or by increasing the number of probe electrodes, to each of which an individual voltage may be applied. In order to move the probe electrodes over a broad region along the surface of the recording medium, an extremely high precision mechanism for coarse adjustment is required, in addition to a mechanism for fine adjustment, such as a cantilever. This presents a problem of scale increase of the overall apparatus. While, if the number of probe electrodes to which respective voltages are independently applied is simply increased to increase the memory capacity, wiring would be so complicated on the side of the probe electrodes and the number of wire connections would significantly increase in number. For example, in a case in which a mechanism for a fine adjustment is provided to independently displace the respective probe electrodes, an increase in wiring is necessary. Thus it is necessary to concentrate the entire wiring on the side of the probe electrodes. It is, therefore, an object of the present invention to provide an apparatus which can perform recording and reproduction of high density and large capacity, and which is simple in wiring and suitable for mass production, thus solving the above problems.

Further, there is a problem in the conventional apparatus that if a transfer rate of transferring information to be recorded is faster than a write speed, which is an addition of a write time of 1 bit, by a probe electrode and an access time for movement of probe electrode to a desired recording area, the transferred information cannot be recorded on the recording medium due to a mismatch caused between the information transfer rate and the write speed. This problem still exists in the case of plural probe electrodes provided in that the mismatch is caused between the information transfer rate and the write speed, though the write speed may be increased within a limited time. It is a further object of the present invention to provide an apparatus having plural probe electrodes, and which allows high speed writing with match a between the information transfer rate and the writing speed.

SUMMARY OF THE INVENTION

An information recording and/or reproducing apparatus comprises a recording medium having a plurality of segmented planar electrodes and a plurality of probe electrodes respectively facing and electrically connected to the plurality of planar electrodes. There is means for independently applying a voltage, for recording and/or reproducing, between each pair of the planar electrodes and the probe electrodes.

DETAILED DESCRIPTION OF THE PREFERRED EMBODIMENTS

EMBODIMENT 1

Figure 1:
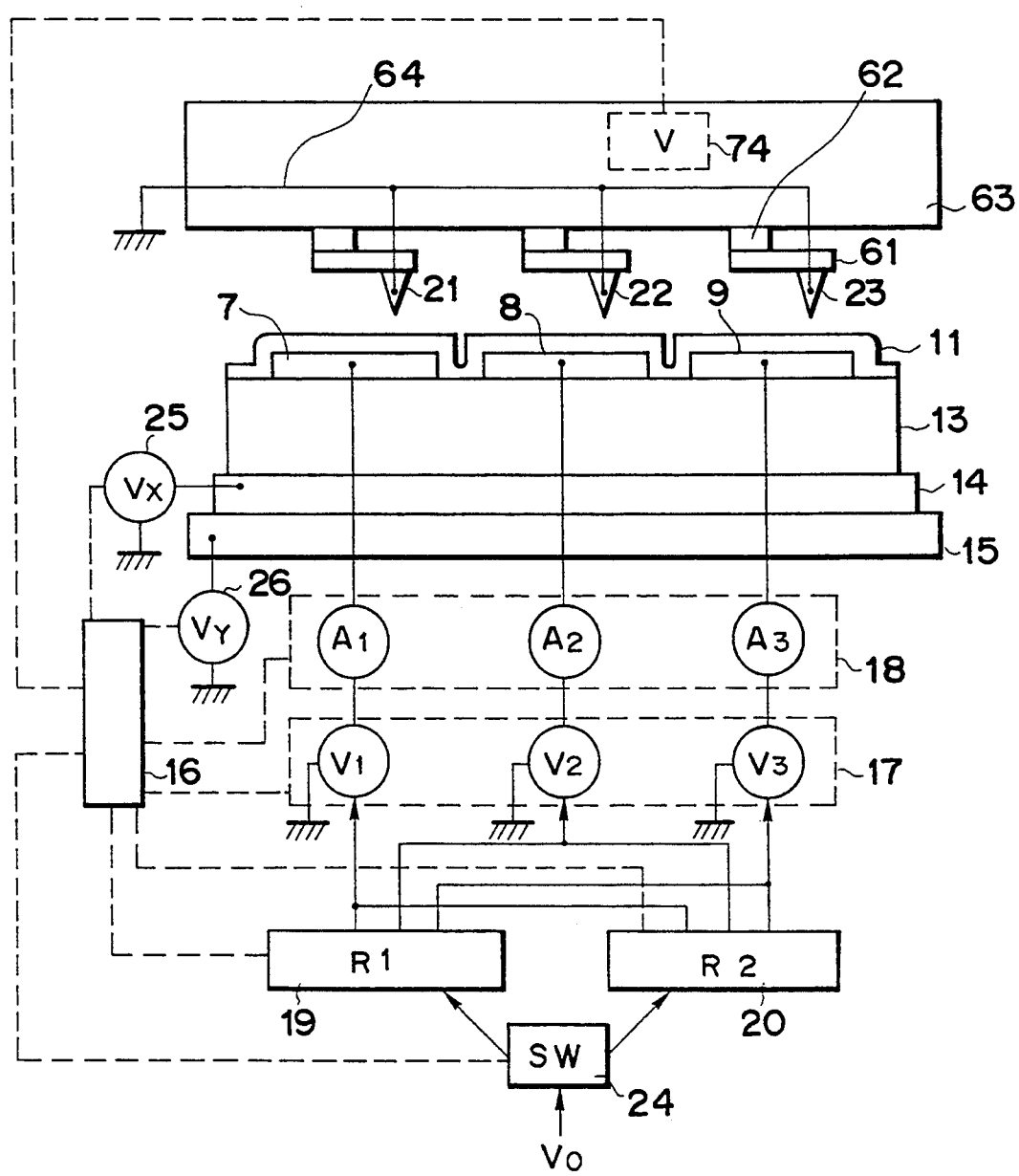
FIG. 1 is a schematic diagram of a whole structure of first embodiment according to the present invention.

FIG. 1 is a schematic diagram of a first embodiment of a recording and/or reproducing apparatus according to the present invention. In FIG. 1, numerals 21-23 are probe electrodes, each of which may be displaced in a direction perpendicular to a surface of a recording layer for adjustment of a distance between the probe electrode and the recording layer. There is a bimorph beam 61 provided as a means for adjusting the distance between each of the probe electrodes and the recording medium. Numeral 62 denotes a base for the bimorph beam 61, and a plurality of bimorph beams or cantilever beams are formed on a single silicon substrate 63. Numeral 74 designates a drive circuit for independently displacing each of bimorph beams. The drive circuit 74 is formed on the same substrate as the silicon substrate 63 by using a semiconductor process. Wiring of independent conductive lines is provided on the silicon substrate 63 to connect each of the bimorph beams to the drive circuit 74, though not shown in FIG. 1. Numeral 64 denotes a conductive line which electrically connects each of the probe electrodes 21-23 ground. The above arrangement constitutes a probe electrode unit.

Further, the following arrangement is provided on the recording medium side to face the probe electrode unit. Numerals 7-9 are a plurality of segmented planar electrodes which are disposed on a single substrate 13 to face the respective probe electrodes 21-23. Numeral 11 denotes a recording layer on which information is recorded by switching, a change of conductivity (current-voltage property) of the recorded part of the recording layer 11, covering the planar electrodes 7-9. The recording medium is constituted by the substrate 13, the planar electrodes 7-9, and the recording layer 11. In the present embodiment, a polyimide thin film made by the Langmuir-Blodgett technique is used as the recording layer 11 of the recording medium. The recording medium, however, is not so limited, and other media may be employed such as those disclosed in Japanese Laid-Open Patent Application Nos. 63-161552 and 63-161553. Although one of features of the present invention is the use of a recording medium having a plurally of segmented electrodes, its arrangement is not limited to one in which the recording layer is formed on the planar electrode, and an arrangement may be employed such that the recording layer itself functioning as an electrode. In the alternative arrangement, the recording medium may be structured by a arrangement of plural blocks of a segmented recording layer functioning as an electrode, which are separated from each other to avoid a contact.

Numeral 16 designates a micro computer for write and read of information to totally control the entire apparatus. Numerals 14, 15 are moving means for relatively moving the probe electrodes 21-23 in the x, y-directions along the surface of recording layer 11, numeral 14 is an x scan mechanism for moving the probe electrodes 21-23 in the x-direction, and 15 is a y scan mechanism for moving them in the y-direction.

Numeral 25 is a drive circuit of the x scan mechanism 14, and $V_x$ represents a drive voltage. Further, numeral 26 is a drive circuit of y scan mechanism 15, and $V_y$ represents a drive voltage thereof. Numeral 17 designates a voltage applying circuit, which applies either a predetermined pulse voltage for write or a predetermined bias voltage for read respectively independently to each set of the planar electrodes 7-9 and the counter probe electrodes 21-23. $V_1$, $V_2$, and $V_3$ represent values of voltage applied to respective pairs of probe electrodes 21-23 and planar electrodes 7-9. Numeral 18 is a current detecting circuit for detecting values of electric current flowing between each pair of probe electrodes and planar electrodes. $A_1$, $A_2$, and $A_3$ represent values of electric current respectively flowing between respective pairs of probe electrodes 21-23 and the planar electrodes 7-9. Data recorded on the medium at a position of a probe may be reproduced by reading a value of electric current flowing through the electric current detecting circuit 18 when the bias voltage for read is applied by the voltage applying circuit 17.

In the present embodiment, since the voltage applying circuit 17 and the electric current detecting circuit 18 are connected on the side of the planar electrodes, sufficient space is created in a mounting density of silicon substrate 63 on the probe electrode side as compared to the conventional apparatus. Further, since the probe electrodes 21-23 are connected by the single common conductive line 64, the wiring on the silicon substrate on the probe electrode side may be advantageously simplified. Especially in the arrangement of the present embodiment using the means (bimorph beam) for independently moving the respective probe electrodes, a number of conductive lines must be wired on the same silicon substrate 63 to connect the respective bimorph beams and the drive circuit, so that the single line connection of probe electrodes is extremely advantageous by reduction in the number of wiring lines.

$V_0$ represents a voltage information signal to be recorded, and numerals 19, 20 designate a first shift register R1 and a second shift register R2 respectively having the same number of memory segments as the number of plural probe electrodes. Numeral 24 denotes a switching circuit, which switches to distribute the serially input information signal $V_0$ to the shift registers 19 and 20. The information signal voltage $V_0$ is temporarily stored in either of the shift registers 19, 20 through switching circuit 24. During storage into a given shift register, the writing of information is carried out in parallel on the recording layer 11 by applying the pulse write voltage between the probe electrodes 21-23 and the planar electrodes 7-9 in correspondence with the information already stored in the other shift register. Thus the first shift register 19 and the second shift register 20 are provided to convert the serial input information into parallel type. The batched writing may be conducted in parallel by smoothly converting the serial type information advantageous in transmission of information with less information lines by alternate input and output of information through the first and second shift registers. Further, since the write voltage is simultaneously applied between the plural planar electrodes 7-9 and the plural probe electrodes 21-23, a fine error in a set position of the probe electrodes relative to the recording medium, which is caused by a temperature drift with time, may be approximately equalized among the probes, assuring stable reliability among the probes.

Figure 2:
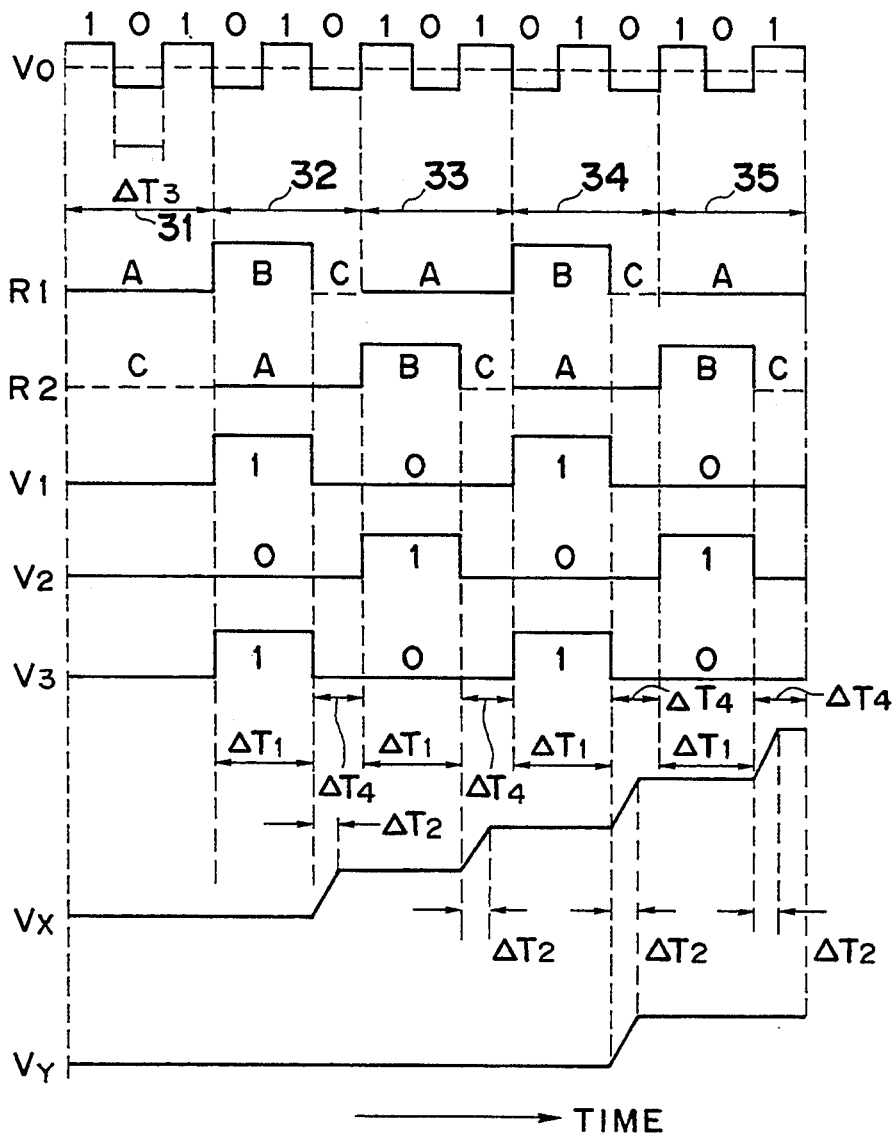
FIG. 2 is a timing diagram of the first embodiment.

FIG. 2 is a timing diagram of drive signals of the apparatus in the present embodiment, in which an axis of abscissa is time, and "1" and "0" are values of information. R1 and R2 show operational states of the first shift register 19 and the second shift register 20, respectively. A represents an input state of information, B an output state of information, and C a clear state of information or a cease state for adjustment. Further, $\Delta T_1$ represents an application period of a write voltage or a write period, and $\Delta T_4$ a non-write period. The voltages of $V_1$-$V_3$ include two kinds of write voltage corresponding to the state "1" and the state "0" in the write period $\Delta T_1$, and a bias voltage normally of about 100-500 mV in the other period. Here, the write voltage corresponding to the state "0" is set to the same value as the bias voltage. $\Delta T_2$ is a period for relatively moving the probe electrodes 21-23 along the surface of recording medium 11 by changing the voltage value of ($V_x$, $V_y$), and $\Delta T_3$ an information transfer time of 1 bit. The information transfer rate may be represented by $1/\Delta T_3$. In FIG. 2, numerals 31-35 denote switching periods of shift registers 19 and 20 as controlled by the switching circuit 24. In the present embodiment, matching is obtained between the information transfer rate $1/\Delta T_3$) and the writing rate $1/(\Delta T_1 + \Delta T_2))$ such that the first shift register 19 and the second shift register 20 are provided with the same number of memory locations as the number of plural probe electrodes, that the input and output of information are carried out in the switching periods 31-35 by the first shift register 19 and the second shift register 20, and that the paired shift registers respectively having three memories for the three probe electrodes are equipped to alternately conduct the input and output.

In the present embodiment, the voltages $V_1$-$V_3$ applied between the plural probe electrodes 21-23 and the segmented electrodes 7-9 have the write period $\Delta T_1$ in which the write voltage is applied and the non-write period $\Delta T_4$, the plural probe electrodes 21-23 are moved in a period $\Delta T_2$ within the non-write period $\Delta T_4$ along the surface of the recording medium 11. After the probe electrodes have made access to a recording position on the recording medium, the voltages are applied, which allows effective application of voltage at the recording position and discrete formation of record bits to advantageously make the judgement of record bits easy.

Specifically, the writing of information is conducted as follows. The switching circuit 24 selects either of the first shift register 19 and the second shift register 20 respectively having the same number of memory locations as the number of plural probe electrodes to consecutively transfer serial information. The storage of information is stopped when one of the shift registers becomes full, with the storage of information corresponding to the number of probes. The write voltages corresponding to the stored information in the shift register are respectively applied between the planar electrodes and the probe electrodes. The batch writing of information is executed in parallel on the plural recording parts made access to by the plural probe electrodes. After completion of writing, the probe electrodes are again moved to another desired region on the recording medium. Next information is transmitted to the other shift register in the same manner as above during the previous write in the one shift register, during the movement of probe electrodes, or in the clear state "C" of the shift register which has just output the write voltages, preparing the next batched writing. The alternative operations are repeated. For example, the information transfer period $\Delta T_3$ of 1 bit out of the information signal $V_0$ having serial information of 101010.. . is shorter than the time $\Delta T_1$ necessary for one probe electrode to write 1 bit, so that it was impossible in the conventional arrangements for one probe electrode to write the above information series on the recording medium 11. Even if a plurality of probe electrodes are used, the writing of the above information series was unreal due to a mismatch between the information transfer rate and the speed of writing. In contrast in the present embodiment, while the switching circuit 24 has the switching period of $3\Delta T_3$ and one of the paired shift registers receives information of three digits out of the information series of $V_0$ in the period of $3\Delta T_3$, the other shift register simultaneously outputs information of three digits input to store during the preceding $3\Delta T_3$ period to the three planar electrodes during the write period of $2\Delta T_3$ ($=\Delta T_1$). Alternately repeating this operation by the two shift registers while matching the information transfer rate with the speed of writing, the writing of the above information series is carried out on the record medium 11.

More specifically, the shift register 19 is in the input state "A" in the section 31 to receive an information series of three digits "101". The shift register 19 is next in the output state "B" in a next section 32 to control the write voltages of $V_1$, $V_2$, and $V_3$ as "1", "0" and "1" based on the information series received in the preceding section 31. Then the shift register 19 is next in into the clear state or cease state for adjustment "C", and the shift register 20 is next in the input state to receive a next information series of "010". Similarly in a next section 33, the shift register 20 is next in the output state to control $V_1$, $V_2$, $V_3$ as "0", "1", "0" based on the information series received in the preceding section 32. The shift register 20 is next in the state "C", and the shift register 19 is next in the input state to receive a following information series of "101". executed. In following sections 33-35 the execution is similar to the split and distribution of information series into the shift registers, the alternate input and output of the shift registers, and the control of write voltages of $V_1$, $V_2$, $V_3$, enabling matching between the information transfer rate and the speed of writing continues

EMBODIMENT 2

Figure 3:
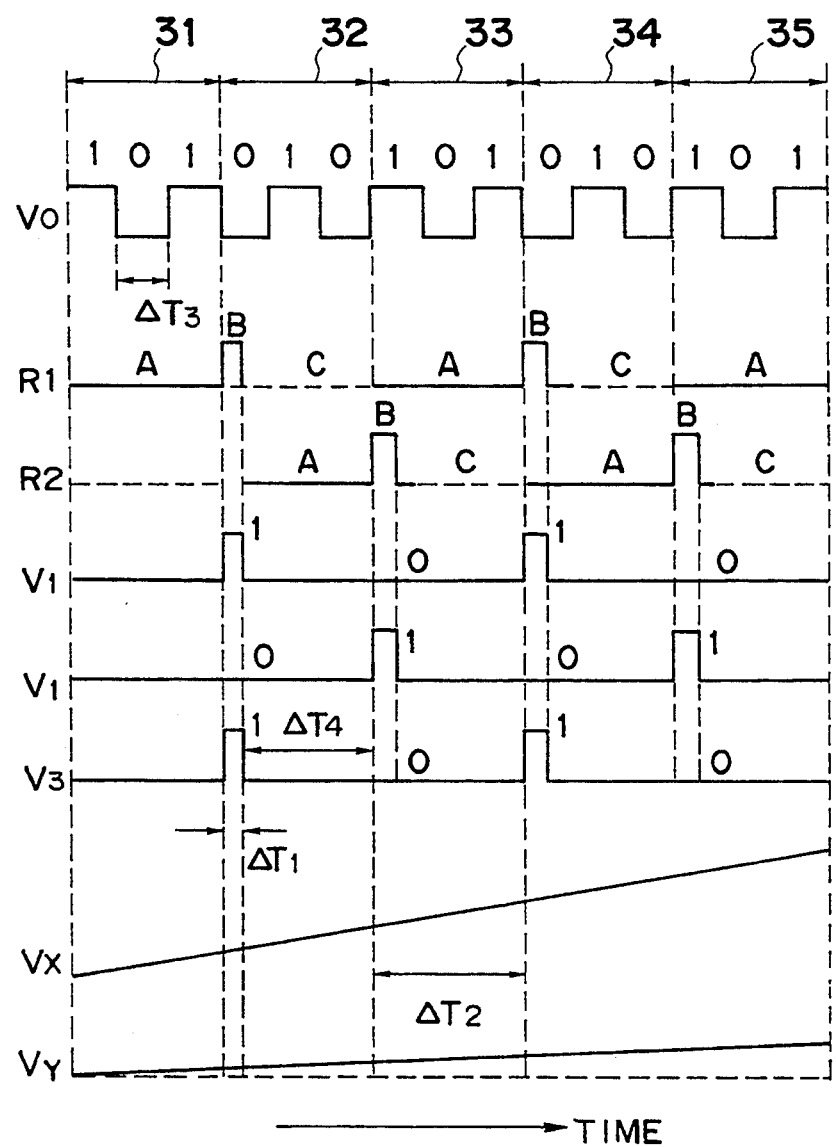
FIG. 3 is a timing diagram of a second embodiment of the invention.

A second embodiment according to the present invention. utilizes the same apparatus as in FIG. 1. FIG. 3 is a a timing diagram of drive signals in the second embodiment according to the present invention. The present embodiment is featured by batched writing with continuous movement of plural probe electrodes 21-23 along the surface of recording medium 11. The other features are the same as in the first embodiment.

In the present embodiment, the probe moving period $\Delta T_2$, which is a time period necessary for movement of probe electrodes by a distance necessary for recognition of 1 bit, is longer than the information transfer period of 1 bit of information signal voltage $V_0$. In such a case, an conventional arrangements did not allow writing of an information series of the above information signal voltage onto the recording medium 11 even with plural probe electrodes. Further, the period $\Delta T_1$ necessary for writing is shorter than $\Delta T_3$. In a case in which $\Delta T_1 > \Delta T_3$, the writing of information series was not allowed.

In the present embodiment, the batch writing is carried out by alternately repeating the input and output of information to and from shift registers 19, 20 while continuously changing values of $V_x$, $V_y$ as shown in the timing diagram of FIG. 3 to two-dimensionally scan or move the surface of recording medium 11 relative to the probe electrodes. This enables the writing onto the record medium 11 even when the information series is transferred in the information transfer period for 1 bit shorter than the moving period $\Delta T_2$ of probe electrodes necessary for the recognition of 1 bit.

EMBODIMENT 3

Figure 4:
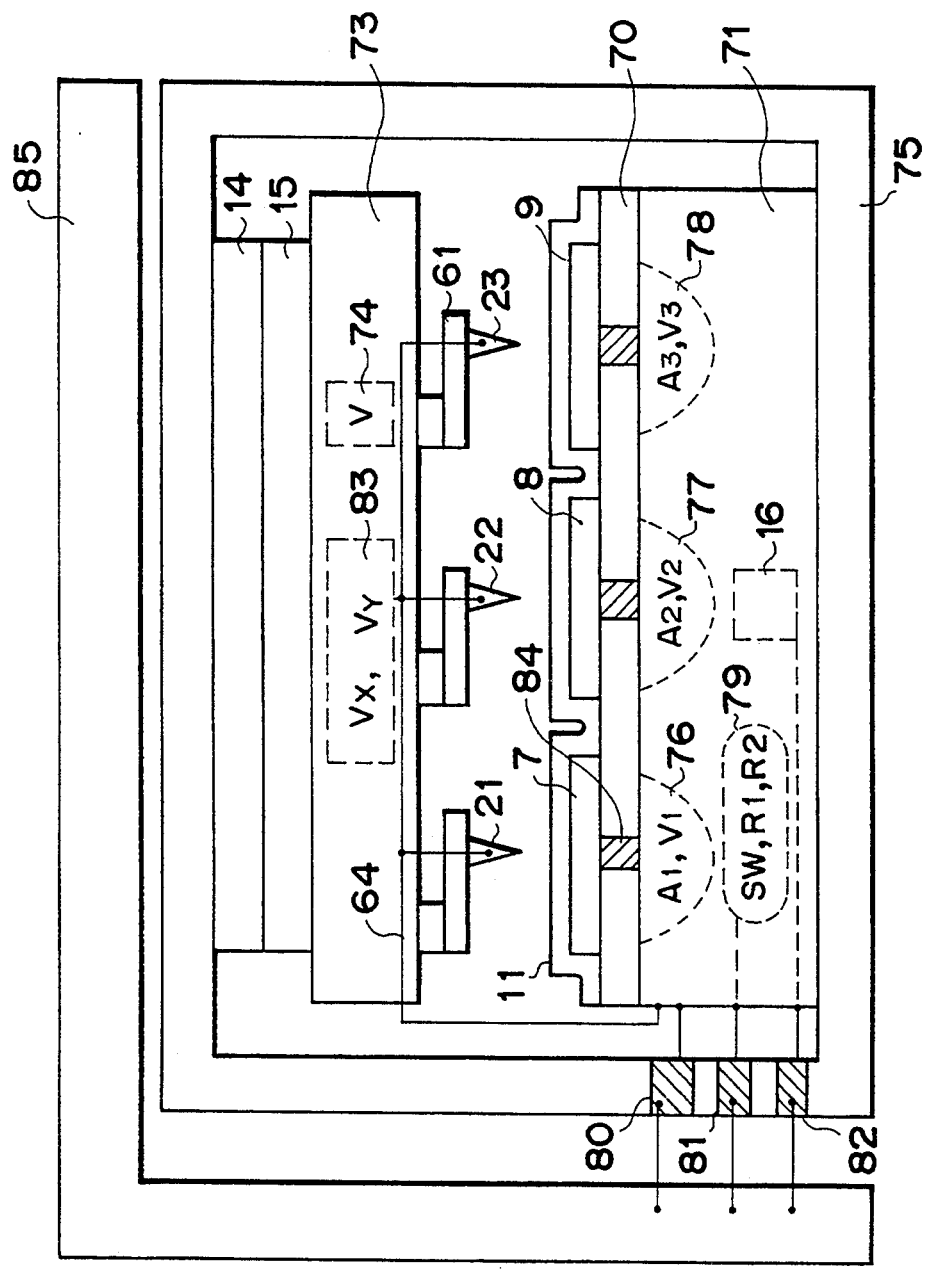
FIG. 4 is a schematic diagram of a whole structure of third embodiment of the invention.

A third embodiment according to the present invention is described relative to FIG. 4. In the present embodiment, planar electrodes are positioned on a semiconductor substrate and an integrated circuit is formed on the side of planar electrodes. The present embodiment prevents concentration of complicated peripheral circuits and wiring lines on the probe electrode side due to the increase in number of probes. Also, the present embodiment has high general-purpose properties in that a closed unit containing the recording medium and other members is detachably mounted.

In FIG. 4, numerals 76-78 are either of voltage applying circuit, electric current detecting circuit, or the both. The voltage applying circuit and the current detecting circuit for respective planar electrodes are formed on a semiconductor substrate 71, on which the planar electrodes are placed. This arrangement achieved simplification of overall apparatus without necessity of complicated wire connections as compared to the conventional arrangements. Further, numeral 70 is an insulating layer for insulating the planar electrodes to electric circuits on the semiconductor substrate, and numeral 84 a through hole electrode for connecting the planar electrodes and the electric circuits on the semiconductor substrate 71. A section 79 functions as a switching circuit and a shift register, so that the switching circuit for switching to distribute information and shift registers are formed on the semiconductor substrate 71. Further, a micro computer 16 is formed on the semiconductor substrate 71. Numeral 83 denotes an xy scan drive circuit formed on the silicon substrate on the side where the probe electrodes are formed, to drive respective scan mechanisms 14, 15. Numeral 85 designates a main body of recording and/or reproducing apparatus on which a closed package 75 with the connection terminals is freely mountable, numeral 80 a connection terminal for power supply, numeral 81 a terminal for information transmission, and 82 a terminal for micro computer control.

The recording and/or reproducing apparatus of the present embodiment is featured by detachable arrangement of a unit in which the probe electrodes, the recording medium, and the segmented planar electrodes are packed together in unity in the closed package 75 with the connection terminals 80-82. The recording and/or reproducing apparatus of the present embodiment is suitable for mass production with high reliability by packaging the complicated peripheral circuits together in a cassette.

EMBODIMENT 4

Figure 5:
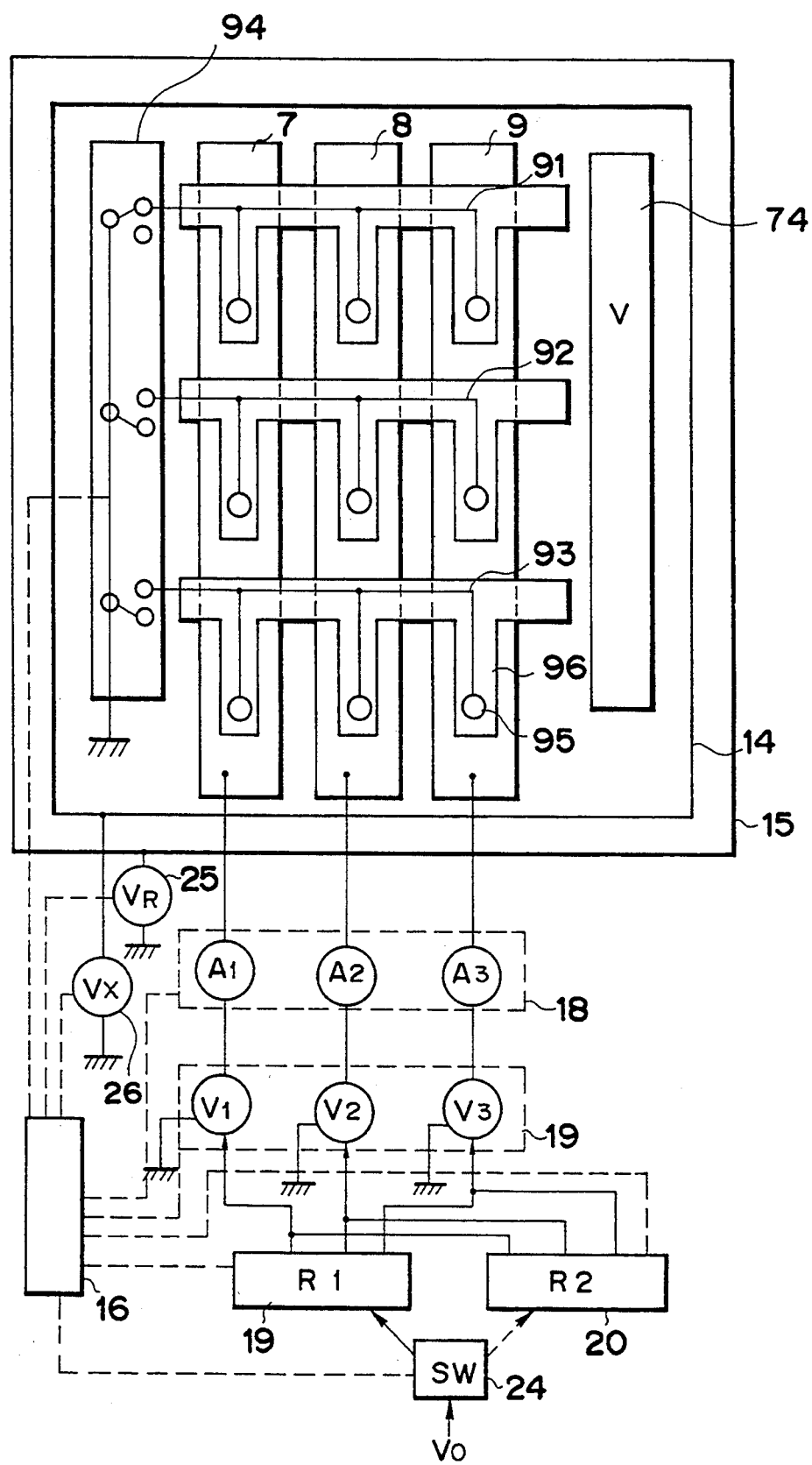
FIG. 5 is a schematic diagram of a whole structure of a fourth embodiment of the invention.

A fourth embodiment according to the present invention is described relative to FIG. 5. The fourth embodiment is the same as the first embodiment except that a plurality of conductive lines are connected to a plurality of probe electrodes.

There are provided in the present embodiment a plurality of conductive lines 91-93 connected to a plurality of parallel segmented electrodes 7-9 and a plurality of probe electrodes 95. Since the plural probe electrodes face mutually different planar electrodes 7-9, which are independently controllable, with a recording medium inbetween which is omitted in FIG. 5, writing information may be transferred in parallel through the planar electrodes 7-9 while sequentially selecting to scan the conductive lines 91-93 having the plural probe electrodes. It is also possible to transfer the write information in parallel through the plural conductive lines 91-93 while sequentially selecting to scan the planar electrodes 7-9, because the planar electrodes face the plural probe electrodes connected to mutually different conductive lines with the recording medium inbetween. The present embodiment has the former arrangement of peripheral circuits. Numeral 94 designates a selection circuit for sequentially selecting the conductive lines 91-93 having the plural probe electrodes one by one in a chronological order, and bimorph beams 96 arranged in a matrix.

In the present embodiment, each of the plural parallel planar electrodes is an electrode of band shape, which is advantageous in that the wiring may be simplified. Especially, the wiring arrangement may be extremely simplified because the conductive lines 91-93 have the plural probes aligned in respective rows relative to each other and facing the respective planar electrodes different from each other, and the rows of plural probes and the columns of band planar electrodes are positioned in a skew relation through the recording medium, forming a matrix arrangement.

EMBODIMENT 5

Figure 6:
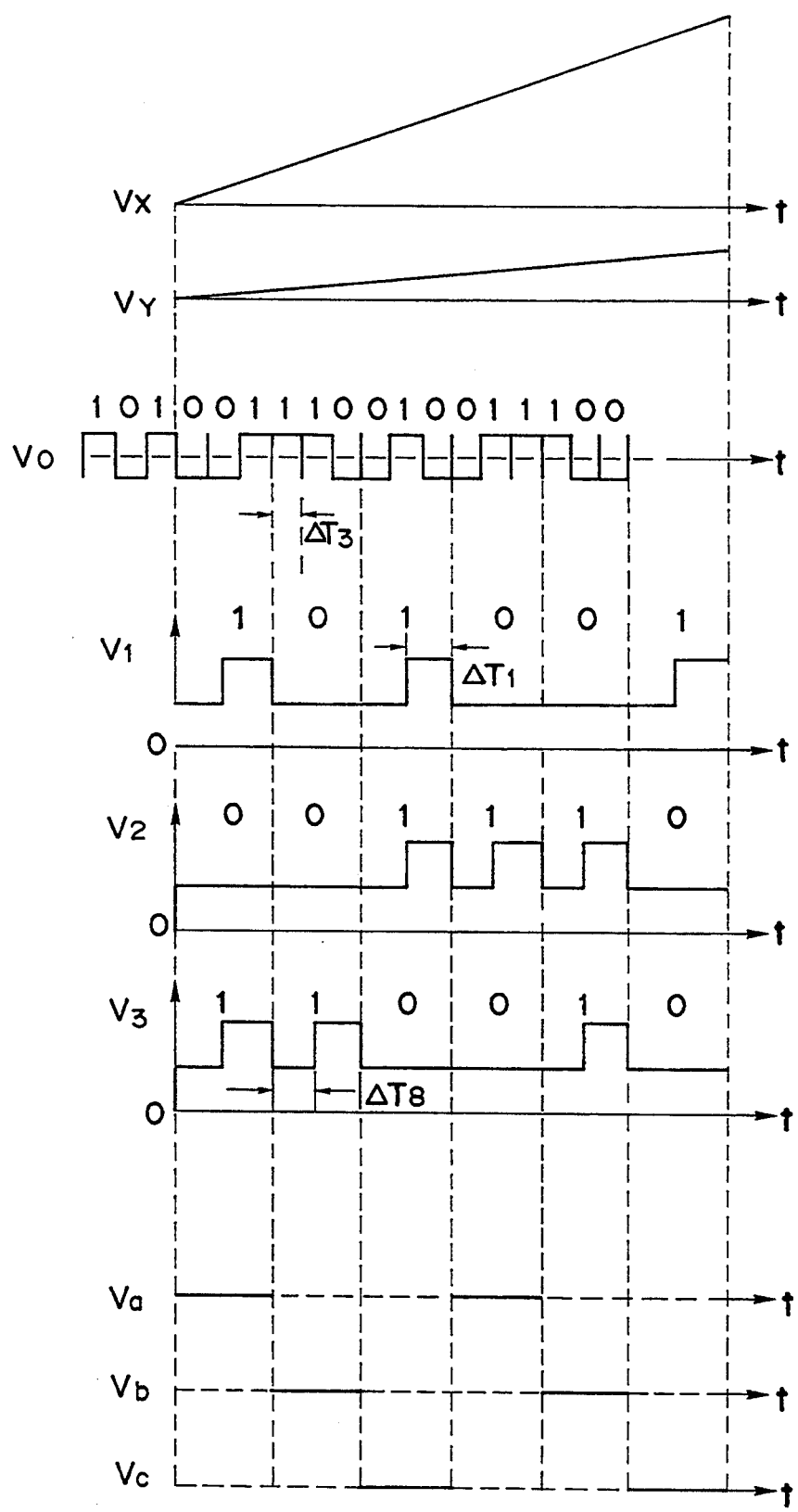
FIG. 6 is a timing diagram of fifth embodiment of the invention.

FIG. 6 is a time diagram of drive signal of a fifth embodiment of the present invention, of recording and-/or reproducing apparatus structured in the same manner as the fourth embodiment. In FIG. 6, $V_a$, $V_b$, $V_c$ represent states of voltage of conductive lines 91-93 connected to plural probes, and line selection states of scanner 94, in which a solid line shows a setting voltage with presence of selection, and a dotted line shows a disconnect state or non-selected state.

A probe electrode in non-selected state is held in a condition separated from a recording medium, and a probe electrode selected by a conductive line having a planar electrode and the plural probes, has a period $\Delta T_8$ for controlling a distance between the recording medium surface and the probe electrode in a selection period, whereby providing a recording and/or reproducing apparatus of high density and large capacity with control of influence of cross talk in the non-write part.

Further, in the present embodiment, at least one group of probe electrodes face respective plural planar electrodes through the recording medium, and the write voltages are simultaneously applied for writing between the planar electrodes and the probe electrode group. The apparatus can perform high speed writing of information transferred thereto at a high speed onto the recording medium by sequentially repeating the writing operation for each of the probe electrode groups. The arrangement is of course not limited by this. For example, a plurality of probe electrodes connected to mutually different conductive lines face the planar electrodes through the recording medium, and the write voltages may be applied between the mutually different conductive lines and the selected planar electrode while consecutively selecting the planar electrodes.

In FIG. 6, for example if an information signal $V_0$ of information series of "101001110010011100" has been transmitted, the information transfer period $\Delta T_3$ of 1 bit is shorter than the period $\Delta T_1$ necessary for writing of 1 bit by one probe electrode. It was conventionally impossible for one probe electrode to write the information series on the recording medium. In the present embodiment, the switching circuit 24 has a switching period of $3\Delta T_3$, one of two shift registers receives information of three digits out of the information series of $V_0$ in the period of $3\Delta T_3$, the other register simultaneously outputs the information of three digits input to store in the preceding period of $3\Delta T_3$ during the write period having $3\Delta T_3$ to transmit the information of three digits to the three planar electrodes 7-9, the shift registers 19, 20 alternately repeat such operation, the scanner 94 consecutively selects the conductive lines 91-93 connected to plural probes in synchronism with the operation, and the probe electrodes are relatively moved along the surface of recording medium by changing the voltages of $V_x$, $V_y$ during the operation, making the writing of large capacity and high speed real with simple wiring suitable for mass production.

Further, there are provided in the present embodiment at least two probe electrodes, preferably three, connected to one or plural conductive line(s), preferably three, so that nine probes may be effectively used by consecutively selecting the conductive lines in a chronological order to apply the write voltage between the planar electrode and the selected conductive line.

EMBODIMENT 6

Figure 7:
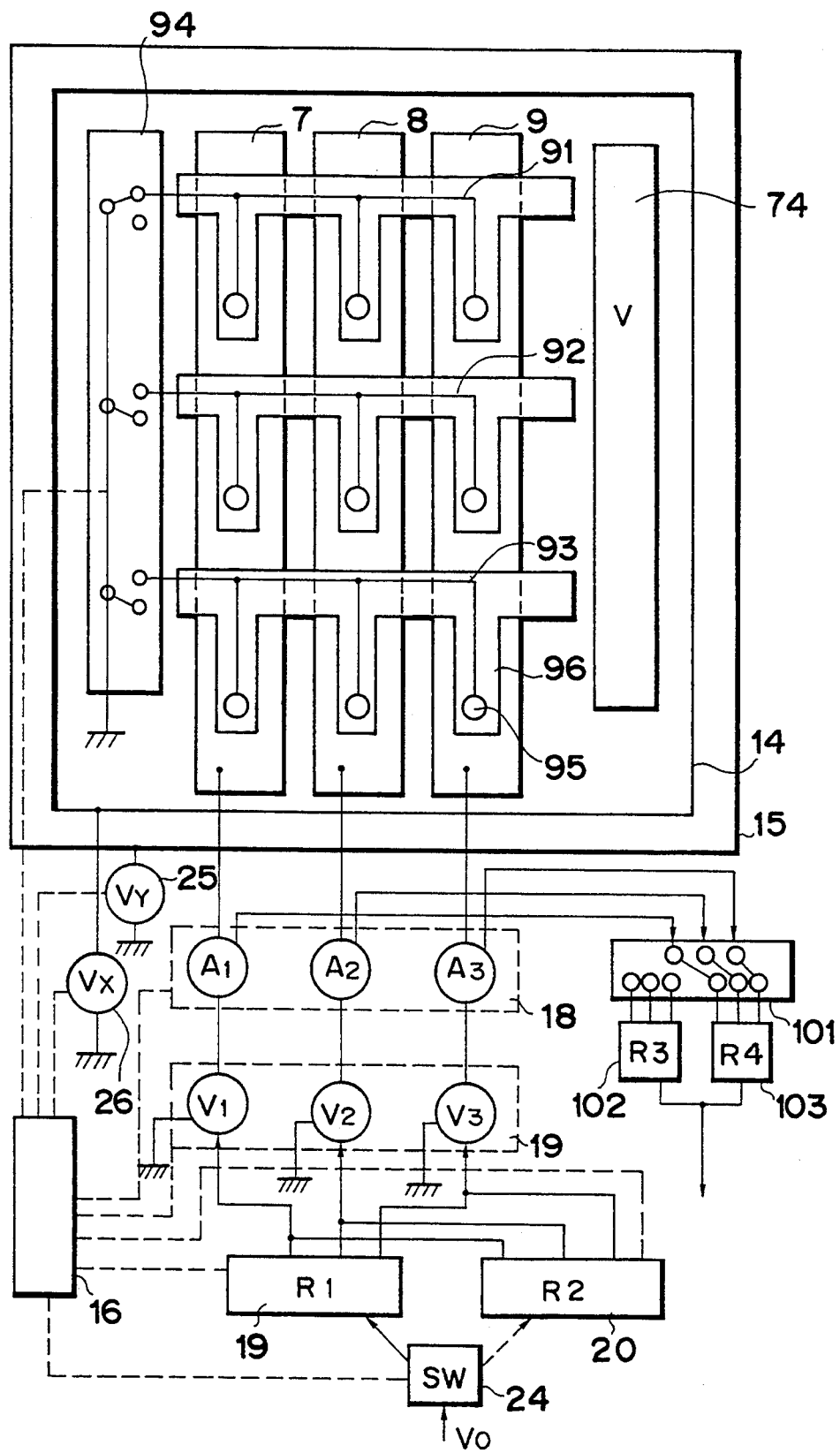
FIG. 7 is a schematic diagram of a whole structure of a sixth embodiment of the invention.
Figure 8:
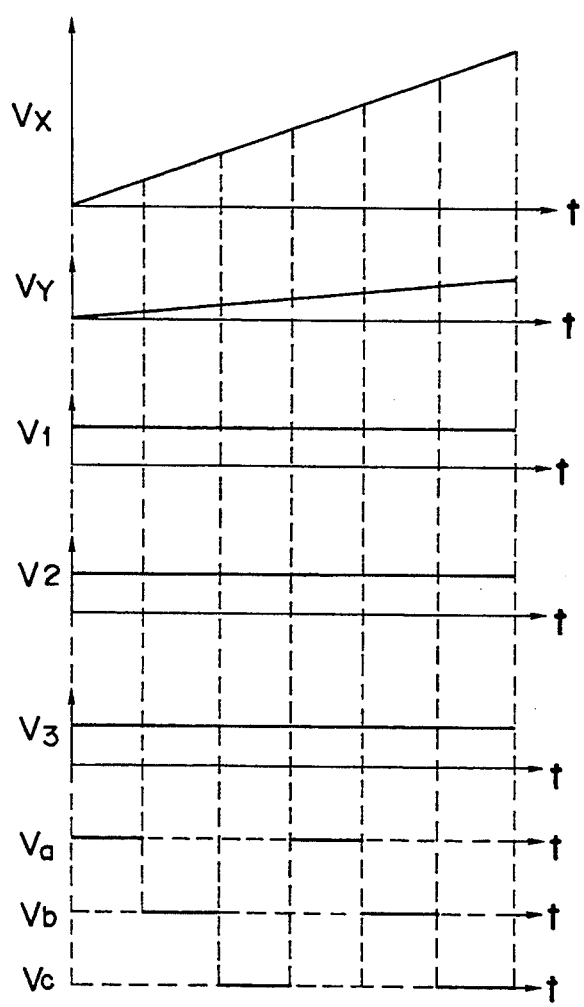
FIG. 8 is a timing diagram of a sixth embodiment of the invention.

FIGS. 7 and 8 are drawings to illustrate an information reproducing apparatus of a sixth embodiment of the present invention, FIG. 7 showing a structure of the overall apparatus, and FIG. 8 is a timing chart. In FIGS. 7 and 8, $V_1$, $V_2$, $V_3$ represent bias voltages of read-out voltages normally of about 100-500 mV, which are applied to planar electrodes 7-9. While probe electrodes are moved along a surface of recording medium by changing voltages of $V_x$, $V_y$ for xy driving, a scanner 94 selectively scans conductive lines 91-93 to read out information written on the recording medium by electric current detecting means 18. Numeral 102 denotes a third shift register R3 and numeral 104 a fourth shift register R4, whereby read-out information is converted from parallel type information into serial type information. Alternate input and output of information by the shift registers reduces the number of information transmission lines. The read-out information by the electric current detecting means 18 is first stored in a memory area 11 other than the recording medium, and then the information is transferred outside, for matching information transmission. Upon selection, the read-out voltages are simultaneously applied for reading between the plural planar electrodes and the plural probe electrodes. In the present embodiment, there are provided a plurality of planar electrodes, the read-out voltages are applied between the probe electrodes and the planar electrodes, values of electric current flowing between the probe electrodes and planar electrodes are detected to detect displacement differences of probe position for read-out of information, enabling high speed reading.

Although the number of probe electrodes and the number of planar electrodes as shown in the above respective embodiments are limited in number for simplification of explanation, a larger number of electrodes, for example 2500, may be disposed in an actual arrangement to obtain an enhanced result.

According to the present invention, the recording and/or reproducing apparatus has high density and a large capacity and may be obtained in at a low cost. The wing is simplified on the probe electrode side, and the apparatus is suitable for mass production.

What is claimed is:

1. An information recording/reproducing apparatus for effecting at least one of recording of information and reproducing of information by using a probe electrode, comprising:

a recording medium having a plurality of band-like planar electrodes arranged in parallel;

a substrate arranged to face said recording medium;

a plurality of conductive lines which are formed in parallel on said substrate and which are arranged to cross said band-like planar electrodes;

a plurality of probe electrodes each of which is arranged at a position where the respective conductive lines and band-like planar electrodes cross each other, said plurality of probe electrodes being electrically connected to said conductive lines and facing said planar electrodes;

selection means for subsequently selecting one of said plurality of conductive lines to be rendered operative; and a voltage applying circuit for independently applying a voltage for recording/reproducing between said respective planar electrodes and said probe electrodes electrically connected to said conductive lines which are rendered operative by said selection means.

2. An information recording/reproducing apparatus for effecting at least one of recording of information and reproduction of information by using a probe electrode, comprising:

a recording medium having an electrode which is divided into a plurality of sections;

a plurality of probe electrodes each of which is grounded and is arranged to face the respective divided sections of said electrode;

a plurality of voltage applying means, connected to the respective divided sections of said electrode, for independently applying a voltage for recording/reproduction between the respective divided sections of said electrode and said probe electrodes facing the respective divided sections of said electrode; and a plurality of current detection means each connected to the respective divided sections of said electrode for independently detecting a current flowing through the respective divided sections of said electrode upon applying the voltage by said voltage applying means.

3. An apparatus according to claim 2, further comprises a silicon substrate for supporting the recording medium wherein said plurality of voltage applying means and said plurality of current detection means are integrated in said silicon substrate.

4. An apparatus according to claim 2, further comprises displacing means, provided on each of said plurality of probe electrodes, for displacing the respective probe electrodes, and a substrate for supporting said plurality of probe electrodes.

* * * * *

UNITED STATES PATENT AND TRADEMARK OFFICE
CERTIFICATE OF CORRECTION

PATENT NO. : 5,373,494
DATED : December 13, 1994
INVENTOR(S) : HIDEYUKI KAWAGISHI, ET AL.

It is certified that error appears in the above-identified patent and that said Letters Patent is hereby corrected as shown below:

COLUMN 1

Line 26, "a atom." should read --an atom.--.
Line 36, "STM a" should read --an STM--.
Line 56, "a STM, the" should read --the STM, a--.
Line 58, "techniques" should read --technique--.

COLUMN 2

Line 5, "allay" should read --array--.
Line 48, "match a" should read --a match--.
Line 63, "first" should read --a first--.
Line 68, "third" should read --a third--.

COLUMN 3

Line 3, "fifth" should read --a fifth--.
Line 33, "ground." should read --to ground.--.
Line 42, "switching," should read --switching--.
Line 52, "Application" should read --Applications--.
Line 58, "functioning" should read --functions--.
Line 60, "a" should read --an--.

COLUMN 4

Line 60, "type." should read --information.--.

UNITED STATES PATENT AND TRADEMARK OFFICE
CERTIFICATE OF CORRECTION

PATENT NO. : 5,373,494
DATED : December 13, 1994
INVENTOR(S) : HIDEYUKI KAWAGISHI, ET AL.

It is certified that error appears in the above-identified patent and that said Letters Patent is hereby corrected as shown below:

COLUMN 5

Line 27, "rate $1/\Delta T_3)$" should read --rate $(1/\Delta T_3)$--.
Line 28, "rate $1/(\Delta T_1+\Delta T_2))$" should read --rate $(1/(\Delta T_1+\Delta T_2))$--.

COLUMN 6

Line 14, "unreal" should read --inaccurate--.
Line 34, "into" should be deleted.
Line 43, "executed." should be deleted.
Line 49, "writing continues" should read --writing.--.
Line 53, "vention." should read --vention--.
Line 64, "an" should be deleted.

COLUMN 8

Line 14, "inbetween" should read --in between--.
Line 23, "inbetween." should read --in between.--.
Line 43, "time" should read --timing-- and "signal" should read --signals--.

COLUMN 9

Line 29, "real" should read --a reality--.

UNITED STATES PATENT AND TRADEMARK OFFICE
CERTIFICATE OF CORRECTION

PATENT NO. : 5,373,494
DATED : December 13, 1994
INVENTOR(S) : HIDEYUKI KAWAGISHI, ET AL.

It is certified that error appears in the above-identified patent and that said Letters Patent is hereby corrected as shown below:

<u>COLUMN 10</u>

Line 9, "high" should read --a high--.
    Line 10, "in" should be deleted.
    Line 11, "wing" should read --wiring--.

Signed and Sealed this

Eleventh Day of April, 1995

BRUCE LEHMAN

*Attest:*

*Attesting Officer*      *Commissioner of Patents and Trademarks*